United States Patent [19]
Benner et al.

[11] Patent Number: 5,992,646
[45] Date of Patent: Nov. 30, 1999

[54] FRAMEWORK FOR SWITCHGEAR CABINETS

[75] Inventors: Rolf Benner, Herborn-Amdorf; Wolfgang Reuter, Burbach, both of Germany

[73] Assignee: Rittal-Werk Rudolf Loh GmbH & Co. KG, Herborn, Germany

[21] Appl. No.: 08/952,805

[22] PCT Filed: Sep. 30, 1996

[86] PCT No.: PCT/EP96/04276

§ 371 Date: Nov. 18, 1997

§ 102(e) Date: Nov. 18, 1997

[87] PCT Pub. No.: WO97/13304

PCT Pub. Date: Apr. 10, 1997

[30] Foreign Application Priority Data

Oct. 4, 1995 [DE] Germany ............. 195 36 950

[51] Int. Cl.⁶ ............................ A47F 7/00; A47B 47/00
[52] U.S. Cl. ............................ 211/26; 312/265.3
[58] Field of Search ...................... 211/183, 189, 211/26; 248/441.1, 459; 312/265.1–265.4, 257.1; 52/653.1

[56] References Cited

U.S. PATENT DOCUMENTS

| | | | |
|---|---|---|---|
| 3,087,768 | 4/1963 | Anderson et al. | 312/265.1 |
| 3,265,419 | 8/1966 | Durnbaugh et al. | 312/265.1 |
| 3,779,177 | 12/1973 | Gigante | 312/265.1 |
| 4,782,637 | 11/1988 | Eriksson et al. | 52/653.1 X |
| 4,968,105 | 11/1990 | Schaars | 312/265.3 X |
| 4,988,008 | 1/1991 | Blum et al. | 211/26 X |
| 5,202,818 | 4/1993 | Betsch et al. | 211/189 |
| 5,222,871 | 6/1993 | Meyer et al. | 417/313 |
| 5,287,800 | 2/1994 | Orednick | 248/165 |
| 5,333,950 | 8/1994 | Zachrai | 312/265.1 |
| 5,380,083 | 1/1995 | Jones et al. | 312/265.3 |
| 5,806,946 | 9/1998 | Benner et al. | 312/265.3 |
| 5,899,545 | 5/1999 | Besserer et al. | 312/257.1 |

FOREIGN PATENT DOCUMENTS

| | | |
|---|---|---|
| 8107658 | 8/1981 | Germany. |
| 8130103 | 8/1982 | Germany. |
| 8433339 | 4/1985 | Germany. |
| 8703695 | 12/1987 | Germany. |
| 4036664 | 5/1992 | Germany. |
| 4132803 | 4/1993 | Germany. |
| 4336187 | 4/1995 | Germany. |
| 4336204 | 4/1995 | Germany. |

*Primary Examiner*—Daniel P. Stodola
*Assistant Examiner*—Jennifer E. Novosad
*Attorney, Agent, or Firm*—Pauley Peterson Kinne & Fejer

[57] ABSTRACT

A framework made of frame pieces for a switchgear cabinet, wherein the frame pieces are preferably laterally reversed in relation to their cross-sectional diagonal and have profiled sides perpendicular to the outer sides of the framework and have fastening recesses. In an area of an inner side, the profiled sides end in sections that form a recess for fastening mounting rails. By combining several known and novel features, a framework having easily manufactured frame pieces is created which optimally meets all requirements for use with a switchgear cabinet.

15 Claims, 3 Drawing Sheets

FRAMEWORK FOR SWITCHGEAR CABINETS

BACKGROUND OF THE INVENTION

1. Field of the Invention

This invention relates to a rack made of frame legs for a switchgear cabinet, wherein the frame legs are preferably embodied mirror-reversed with respect to a cross-sectional diagonal line and have profile sides, which extend vertically with respect to exteriors of the rack, have fastening receptacles and in an area of an interior make a transition into sections which constitute a receptacle for fastening mounting rails.

2. Description of Prior Art

A rack of this type is known from German Patent Reference DE 43 36 204 A1, wherein the receptacle is bordered by sections of the frame leg which extend vertically with respect to profile sides of the frame legs and form a receptacle for mounting rails which are essentially square in cross section.

Frame legs for racks of a switchgear cabinet are known in the most varied cross-sectional shapes, as is also disclosed in German Patent References DE 40 36 664 A1, DE 41 32 803 A1, DE 81 07 658 U1 and DE 87 03 695 U1.

The frame legs in accordance with German Patent References DE 40 36 664 A1 and DE 81 07 658 U1 have receiving grooves for sealing elements on the outsides of the rack.

It is known from German Patent References DE 41 32 803 A1 and DE 87 03 695 U1 to attach connecting sections at an angle of 135° to the sections constituting the exteriors of the rack, which are connected with the profile sides by profile sections extending vertically above the profile sides.

Respectively different profile sections extending parallel and vertically with respect to the profile sides forming the exterior, which are oriented toward the interior of the rack and have fastening receivers, are shown in German Patent References DE 81 07 658 U1 and DE 87 03 695 U1.

All these known racks put together from frame legs more or less meet the requirements made on a switchgear cabinet. In one case the sealed attachment of the sheathing elements on the rack is improved, while in another case the fastening opportunities on the interior of the rack are used and made easier. The beveling of the exterior edges results in a receptacle for the bevels of sheathing elements and space for hinge and locking elements.

SUMMARY OF THE INVENTION

It is one object of this invention to provide a rack of the type mentioned at the outset which, with frame legs which are easy to produce, meets requirements made on a switchgear cabinet in regard to sealed attachment of beveled sheathing elements, the creation of a sufficiently large receptacle on the exterior edges for the bevels of the sheathing elements and for the attachment of hinge and locking elements, and of the universal fastening possibilities in the area of the interior of the rack, in an optimal manner.

In accordance with one preferred embodiment of this invention, the above object is attained by a combination of the following features:

a) profile sides of the frame legs are connected with each other via a connecting section which forms a beveled exterior edge of the rack;

b) transitions between the connecting section and the profile sides of the frame legs are embodied as double-layered sealing strips or as U-shaped contact strips, which are oriented vertically with respect to an exterior of the rack and with a contact section extending parallel with the associated exterior, wherein the sealing strips and the contact strips can also be of zero length;

c) at edges facing away from the connecting section, the profile sides make a transition into receiving sections with fastening receivers, which extend vertically with respect to the associated profile side and are bent in toward the connecting section; and d) facing away from the profile sides, the receiving sections make a transition into end sections which form an open or closed dove-tailed groove symmetrically with respect to the cross-sectional diagonal line.

It is possible to continue to produce frame legs of the rack, embodied and oriented in this way, easily and with sufficient stability, preferably with torsional stiffness, wherein the production with stamped and bent elements or as extruded profile sections offers itself.

The sealing strips can cooperate with sealing elements on the sheathing elements such that a sealed closure of the open sides of the rack is achieved. If contact strips are formed out, the contact strips can also support the sealing elements. The connecting section creates an outer edge receptacle on the rack which preferably is symmetrical with respect to the cross-sectional diagonal line of the frame leg cross sections and offers sufficient space for the bevels of the abutting sheathing elements, wherein there is sufficient space available for also attaching the hinge and lock elements of a cabinet door. The receptacle terminating as a dove-tailed groove on an inside of the frame legs offers excellent fastening possibilities for mounting rails and the like, wherein in a simple case a sort of interlocking can be selected. Besides the receiving sections, the profile sides of the frame legs can also be utilized as fastening surfaces, which provides fastening possibilities in several directions.

In accordance with one embodiment, for sealing, the double-layer sealing strips are formed by a strip section extending at an angle of 135° with respect to the connecting section and by a portion of the profile sides, which are connected with each other via a rounded transition. The contact strips can be formed by a strip section extending at an angle of 135° with respect to the connecting section, which are connected with each other via the contact section extending parallel to the exterior of the rack.

The reception for the mounting rails of the frame legs is supplemented by means of the dove-tailed groove because the open dove-tailed groove is formed by simple end sections, which follow the receiving sections at an obtuse angle and are bent in the direction toward the associated profile side. The closed dove-tailed groove can be formed by double-angled end sections, wherein the first partial sections follow the receiving sections at an obtuse angle and are bent in the direction toward the associated profile side, while the second partial sections are oriented toward each other and parallel to the connecting section.

In this case it is possible with the closed dove-tailed groove for the second partial sections of the double-angled end sections to rest against the inside of the connecting section and to be preferably connected with it, for example using a glued, welded or spot-welded connection, in order to increase the torsional stiffness of the frame legs and therefore of the rack.

In accordance with a further embodiment of this invention, it is possible to improve the stability of the frame legs, in particular their torsional stiffness because the connecting section is stiffened by two outward bent stiffening beads, which are preferably arranged symmetrically to the cross-sectional diagonal line and respectively have a first section which is preferably parallel to the facing exterior of the frame leg, and a second section which is preferably parallel to the facing profile side.

The universal fastening possibilities in an area of an interior of the rack can be achieved because the profile sides and/or the receiving sections have rows of fastening receptacles (if desired in a grid system).

BRIEF DESCRIPTION OF THE DRAWINGS

This invention is explained in detail in view of frame legs for a rack of a switch-gear cabinet, which are represented in cross section in the drawings wherein.

DESCRIPTION OF PREFERRED EMBODIMENTS

All exemplary embodiments shown have in common frame legs 10 which are preferably embodied to be mirror-reversed in relation to the cross-sectional diagonal line 11, so that the frame legs 10 can be used for every frame leg 10 of the rack. The orientation in the racks is such that the frame legs 10 do not form an exterior edge but form an exterior edge receptacle towards it by means of a connecting section 12, into which the bevels of the sheathing elements and cabinet door project. It is also possible to fasten hinge and lock elements on the connecting section 12.

Figure 1:
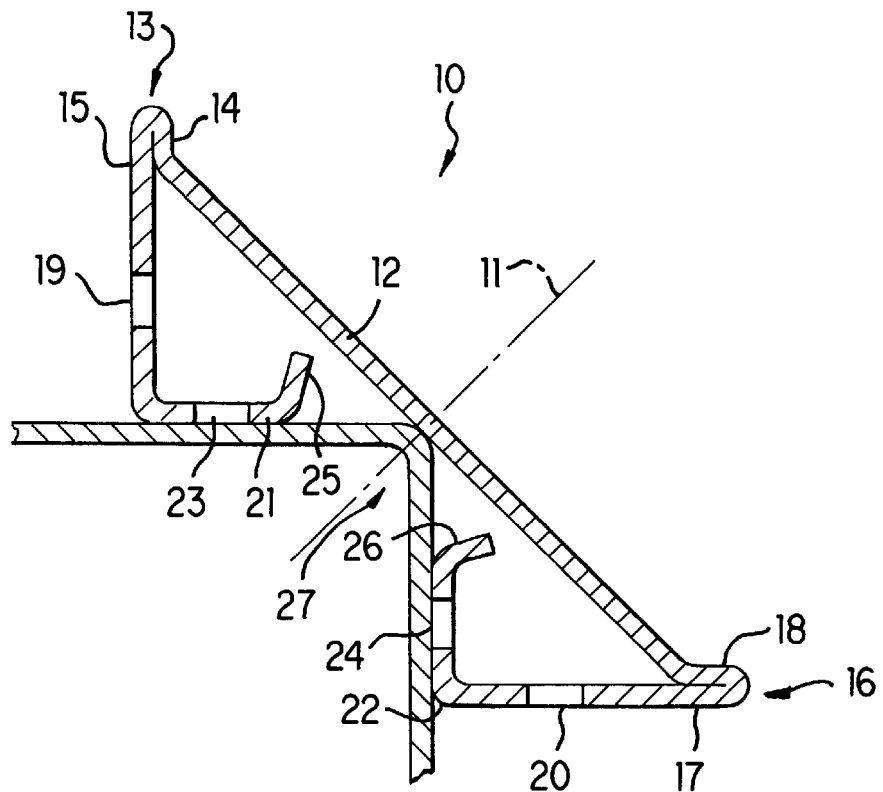
FIG. 1 is a sectional view of a frame leg with two sealing strips and a receptacle with an open dove-tailed groove.

In the exemplary embodiment shown in FIG. 1, the connecting section 12 makes a transition via the sealing strips 13 and 16 into profile sides 15 and 17, which can have rows of fastening receptacles 19 and 20. The profile sides 15 and 17 are aligned vertically with respect to facing exteriors of the rack. The sealing strips 13 and 16 are embodied in a double layer by a strip section 14 and 18, which can also have zero length, and a part of the profile sides 15 and 17, wherein the strip sections 14 and 18 also extend vertically with respect to the facing exteriors of the rack. The strip sections 14 and 18 are rounded and make a transition into the profile sides 15 and 17. If the sheathing elements have sealing elements, definite sealing between the frame leg 10 and the sheathing elements is achieved by the sealing strips 13 and 16 projecting away from the frame leg 10.

The profile sides 15 and 17 form fastening surfaces in two directions. The edges of the profile sides 15 and 17 facing away from the sealing strips 13 and 16 make transitions into receiving sections 21 and 22, which also have fastening receptacles 23 and 24 and delimit a receptacle in which mounting rails can be fastened. The receiving sections 21 and 22 extend vertically with respect to the profile sides 15 and 17 and are bent in the direction toward the connecting section 12. Simply beveled end sections 25 and 26 follow the receiving sections 21 and 22, which extend at an obtuse angle with respect to the receiving sections 21 and 22 and delimit an open dove-tailed groove 27, in which mounting rails can be fastened in a simple manner.

Figure 2:
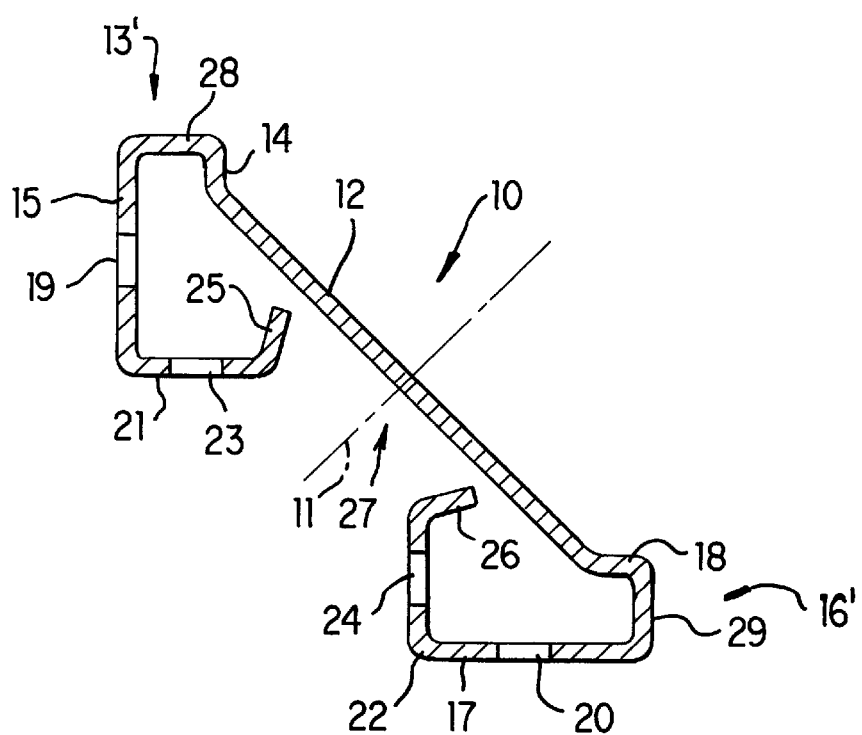
FIG. 2 is a sectional view of a frame leg with two contact strips and a receptacle with an open dove-tailed groove.

As shown by the exemplary embodiment in FIG. 2, it is also possible to form contact strips 13' and 16' at the transitions from the connecting section 12 to the profile sides 15 and 17, which are formed by the strip sections 14 and 18, which can also be of zero length, the contact sections 28 and 29 and portion of the profile sides 15 and 17. The contact sections 28 and 29 extend parallel with the facing exteriors of the rack and can have sealing elements. The remaining construction of the frame leg 10 does not differ from that of the frame leg 10 in accordance with FIG. 1.

Figure 3:
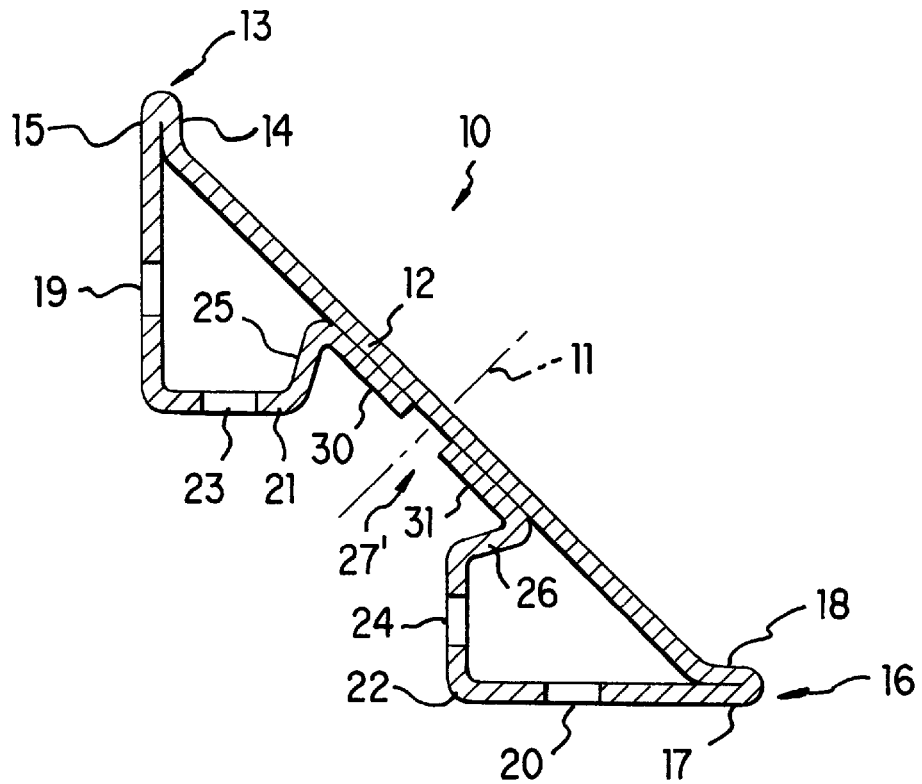
FIG. 3 is a sectional view of a frame leg with two sealing strips and a receptacle with a closed dove-tailed groove.
Figure 4:
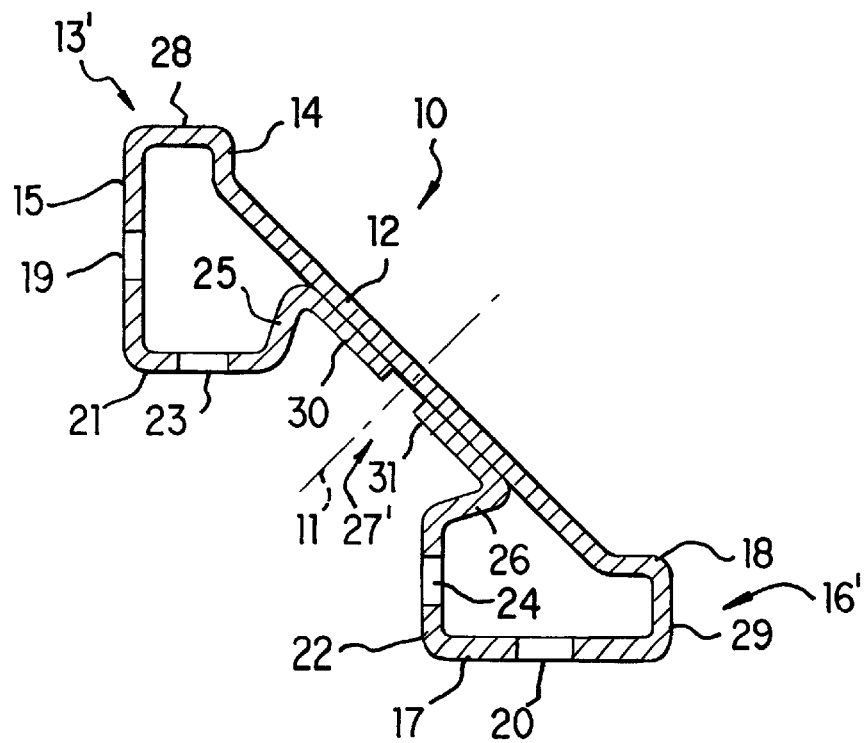
FIG. 4 is a sectional view of a frame leg with two contact strips and a receptacle with a closed dove-tailed groove.

As the exemplary embodiments in accordance with FIGS. 3 and 4 show, it is also possible for double-angled end sections 25, 30 and 26, 31, which delimit a closed dove-tailed groove 27', to be connected to the receiving sections 21 and 22. The first partial sections again extend at an obtuse angle from the receiving sections 21 and 22, while the second partial sections are parallel with the connecting section 12 and preferably rest against its interior and are connected therewith, for example glued, welded or spot-welded.

Figure 5:
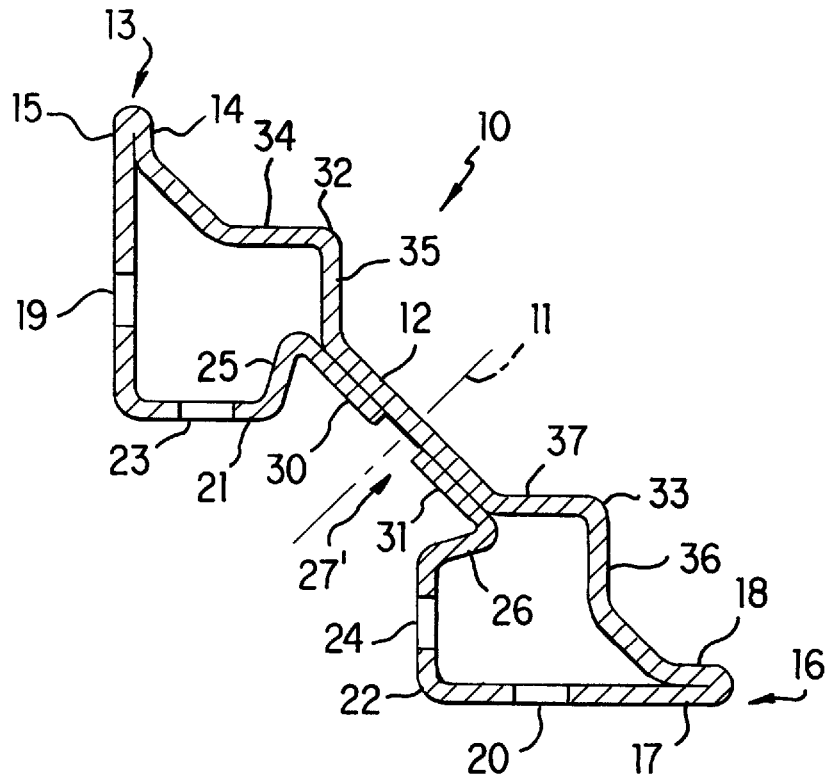
FIG. 5 is a sectional view of a frame leg in accordance with FIG. 3 with an additional stiffened connecting strip.
Figure 6:
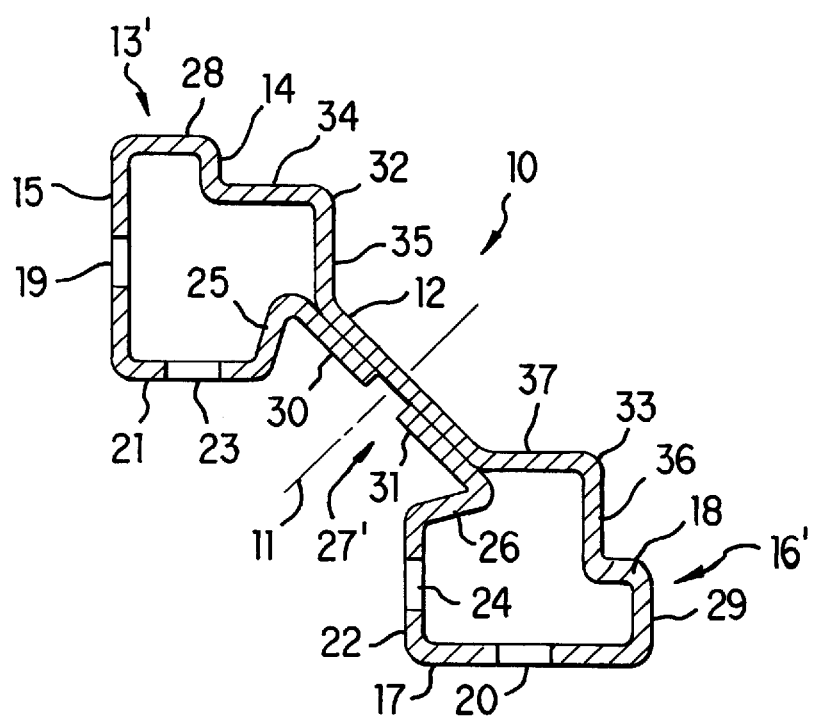
FIG. 6 is a sectional view of a frame leg in accordance with FIG. 4 with an additional stiffened connecting strip.

As the exemplary embodiments in accordance with FIGS. 5 and 6 show, the torsional stiffness of the frame leg 10 can be increased by means of additional stiffening of the connecting section 12. The connecting section 12 is stiffened, preferably symmetrically with respect to the cross-sectional diagonal line 11, by two outward bent stiffening beads 32 and 33. These stiffening beads 32 and 33 respectively include a section 34 and 36, which preferably extend parallel with the facing exterior of the rack, and a section 35 and 37, which is preferably oriented parallel with the facing profile side 15 and 17. In this case the bulge is such that the function of the sealing strips 13 and 16 or of the contact strips 13' and 16' is not hampered.

We claim:

1. In a rack having frame legs for a switchgear cabinet, wherein the frame legs are mirror-reversed with respect to a cross-sectional diagonal line and have profile sides which extend perpendicularly with respect to an exterior of the rack, have fastening receptacles and near an interior make a transition into sections which constitute fastening receptacles for fastening mounting rails, the improvement comprising:

a) the profile sides (15, 17) of the frame legs (10) connected with each other via a connecting section (12) which forms a beveled exterior edge of the rack;

b) the transitions between the connecting section (12) and the profile sides (15, 17) of the frame legs (10) formed as one of double-layered sealing strips (13, 16) and U-shaped contact strips (13', 16') which are oriented perpendicularly with respect to the exterior of the rack and with a contact section (28, 29) extending parallel with the associated exterior;

c) at the edges extending away from the connecting section (12), the profile sides (15, 17) making a transition into receiving sections (21, 22) with fastening receptacles (23, 24), which extend perpendicularly with respect to the associated profile side (15, 17) and are bent in toward the connecting section (12); and d) extending away from the profile sides (15, 17) and toward the connecting section (12), the receiving sections (21, 22) making a transition into end sections (25, 26 or 25, 30; 26, 31) which form one of a symmetrically open and a symmetrically closed dove-tailed groove (27, 27') symmetrically arranged with respect to the cross-sectional diagonal line.

2. In the rack in accordance with claim 1, wherein the double-layer sealing strips (13, 16) are formed by a strip section (14, 18) which extends at an angle of 135° with respect to the connecting section (12) and by a portion of the profile sides (15, 17) which are connected with each other via a rounded transition.

3. In the rack in accordance with claim 1, wherein the contact strips (13', 16') are formed by a strip section (14, 18) which extends at an angle of 135° with respect to the connecting section (12) and the contact strips (13', 16') are connected with the connecting section (12) by the contact section (28, 29) extending parallel with the exterior of the rack.

4. In the rack in accordance with claim 3, wherein the open dove-tailed groove (27) is formed by end sections (25, 26) which follow the receiving sections (21, 22) at an obtuse angle and are bent in a direction toward the associated profile side (15, 17).

5. In the rack in accordance with claim 3, wherein the closed dove-tailed groove (27') is formed by double-angled end sections (25, 30; 26, 31) wherein first partial sections follow the receiving sections (21, 22) at an obtuse angle and are bent in a direction toward the associated profile side (15, 17), while second partial sections are oriented toward each other and parallel with the connecting section (12).

6. In the rack in accordance with claim 5, wherein the second partial sections of the double-angled end sections (25, 30; 26, 31) rest against an inside of the connecting section (12) and are connected with the inside of the connecting section (12).

7. In the rack in accordance with claim 6, wherein the connecting section (12) is stiffened by two outward bent stiffening beads (32, 33) which are arranged symmetrically with respect to the cross-sectional diagonal line (11) and respectively have a first section (34, 36) which is parallel to a facing exterior of the frame leg, and a second section (36, 37) which is parallel to a facing profile side (15, 17).

8. In the rack in accordance with claim 7, wherein at least one of the profile sides (15, 17) and the receiving sections (21, 22) have rows of fastening receptacles (19, 20, 23, 24) in a grid system.

9. In the rack in accordance with claim 1, wherein the open dove-tailed groove (27) is formed by end sections (25, 26) which follow the receiving sections (21, 22) at an obtuse angle and are bent in a direction toward the associated profile side (15, 17).

10. In the rack in accordance with claim 1, wherein the closed dove-tailed groove (27') is formed by double-angled end sections (25, 30; 26, 31) wherein first partial sections follow the receiving sections (21, 22) at an obtuse angle and are bent in a direction toward the associated profile side (15, 17), while second partial sections are oriented toward each other and parallel with the connecting section (12).

11. In the rack in accordance with claim 10, wherein the second partial sections of the double-angled end sections (25, 30; 26, 31) rest against an inside of the connecting section (12) and are connected with the inside of the connecting section (12).

12. In the rack in accordance with claim 1, wherein the connecting section (12) is stiffened by two outward bent stiffening beads (32, 33) which are arranged symmetrically with respect to the cross-sectional diagonal line (11) and respectively have a first section (34, 36) which is parallel to a facing exterior of the frame leg, and a second section (36, 37) which is parallel to a facing profile side (15, 17).

13. In the rack in accordance with claim 1, wherein at least one of the profile sides (15, 17) and the receiving sections (21, 22) have rows of fastening receptacles (19, 20, 23, 24) in a grid system.

14. In a rack having frame legs for a switchgear cabinet, wherein the frame legs are mirror-reversed with respect to a cross-sectional diagonal line and have profile sides which extend perpendicularly with respect to an exterior of the rack, have fastening receptacles and near an interior make a transition into sections which constitute fastening receptacles for fastening mounting rails, the improvement comprising:

a) the profile sides (15, 17) of the frame legs (10) connected with each other via a connecting section (12) which forms a beveled exterior edge of the rack;

b) the transitions between the connecting section (12) and the profile sides (15, 17) of the frame legs (10) formed as double-layered sealing strips (13, 16) which are oriented perpendicularly with respect to the exterior of the rack and with a contact section (28, 29) extending parallel with the associated exterior;

c) at the edges extending away from the connecting section (12), the profile sides (15, 17) making a transition into receiving sections (21, 22) with fastening receptacles (23, 24), which extend perpendicularly with respect to the associated profile side (15, 17) and are bent in toward the connecting section (12);

d) extending away from the profile sides (15, 17) and toward the connecting section (12), the receiving sections (21, 22) making a transition into end sections (25, 26 or 25, 30; 26, 31) which form one of a symmetrically open and a symmetrically closed dove-tailed groove (27, 27') symmetrically arranged with respect to the cross-sectional diagonal line; and e) the double-layer sealing strips (13, 16) formed by a strip section (14, 18) which extends at an angle of 135° with respect to the connecting section (12) and by a portion of the profile sides (15, 17) which are connected with each other via a rounded transition.

15. In a rack having frame legs for a switchgear cabinet, wherein the frame legs are mirror-reversed with respect to a cross-sectional diagonal line and have profile sides which extend perpendicularly with respect to an exterior of the rack, have fastening receptacles and near an interior make a transition into sections which constitute fastening receptacles for fastening mounting rails, the improvement comprising:

a) the profile sides (15, 17) of the frame legs (10) connected with each other via a connecting section (12) which forms a beveled exterior edge of the rack;

b) the transitions between the connecting section (12) and the profile sides (15, 17) of the frame legs (10) formed as one of double-layered sealing strips (13, 16) and U-shaped contact strips (13', 16') which are oriented perpendicularly with respect to the exterior of the rack and with a contact section (28, 29) extending parallel with the associated exterior;

c) at the edges extending away from the connecting section (12), the profile sides (15, 17) making a transition into receiving sections (21, 22) with fastening receptacles (23, 24), which extend perpendicularly with respect to the associated profile side (15, 17) and are bent in toward the connecting section (12);

d) extending away from the profile sides (15, 17) and toward the connecting section (12), the receiving sections (21, 22) making a transition into end sections (25, 26 or 25, 30; 26, 31) which forms a symmetrically closed dove-tailed groove (27, 27') symmetrically arranged with respect to the cross-sectional diagonal line; and e) first partial sections of the closed dove-tailed groove (27') formed by double-angled end sections (25, 30; 26, 31) which follow the receiving sections (21, 22) at an obtuse angle and are bent in a direction toward the associated profile side (15, 17), while second partial sections are oriented toward each other and parallel with the connecting section (12).

\* \* \* \* \*